United States Patent [19]

Carlson

[11] 4,317,844

[45] Mar. 2, 1982

[54] SEMICONDUCTOR DEVICE HAVING A BODY OF AMORPHOUS SILICON AND METHOD OF MAKING THE SAME

[75] Inventor: David E. Carlson, Yardley, Pa.

[73] Assignee: RCA Corporation, New York, N.Y.

[21] Appl. No.: 124,645

[22] Filed: Feb. 25, 1980

Related U.S. Application Data

[60] Continuation of Ser. No. 840,038, Oct. 6, 1977, abandoned, which is a division of Ser. No. 710,183, Jul. 30, 1976, Pat. No. 4,064,521, which is a continuation-in-part of Ser. No. 659,268, Feb. 19, 1976, abandoned, which is a continuation-in-part of Ser. No. 599,588, Jul. 28, 1975, abandoned.

[51] Int. Cl.³ ............................................. C23C 11/00
[52] U.S. Cl. ...................................... 427/39; 204/164; 118/50.1; 118/723; 427/84; 427/85; 427/86; 427/88
[58] Field of Search ....................... 427/38, 39, 84, 85, 427/86, 88; 204/164; 357/2, 30, 4, 15; 118/723, 50.1

[56] References Cited

U.S. PATENT DOCUMENTS

| | | | |
|---|---|---|---|
| 2,932,591 | 8/1960 | Goodman | 427/41 |
| 3,318,790 | 5/1967 | Carbajal et al. | 427/41 |
| 3,485,666 | 12/1969 | Sterling et al. | 427/39 |
| 3,519,901 | 7/1970 | Bean et al. | 427/39 |
| 3,650,929 | 3/1972 | Lertes | 427/39 |
| 3,655,438 | 4/1972 | Sterling et al. | 427/39 |

FOREIGN PATENT DOCUMENTS 933549  8/1963  United Kingdom .

OTHER PUBLICATIONS

Zairyo, "Electronic Materials," Sep. 1979, pp. 111-115 (Japanese).
Chittick et al., "J. Electro Chem. Soc." V 116 #1 (1969) pp. 77-81.
Stoke et al. (Ed.) *Amorphous and Liquid Semiconductors*, John Wiley & Sons Inc., New York (1974) pp. 1-11.
Chittick "Journ. of Non-Crystalline Solids III," 1970, pp. 255-270.
Spear et al. "Solid State Communications" V17, pp. 1193-1196 (1975).
Blum "Journ. of Non-Crystalline Solids II" (1972) pp. 242-246.
Nagasima "J. Vac. Sci. Technology" V14 #1, Jan.-/Feb. 1977, pp. 54-56.
Brodsky et al. "Physical Review B" V1 #6, Mar. 15, 1970, pp. 2632-2641.
Brodsky et al. (Ed.) *Amorphous Semiconductors*, pp. 1-3, Springer-Verlas, New York, 1979.
LeComber et al., "Physical Review Letters", V25 #8, (1970) pp. 509-511.

*Primary Examiner*—John H. Newsome
*Attorney, Agent, or Firm*—Birgit E. Morris; Donald S. Cohen; Robert P. Seitter

[57] ABSTRACT

An amorphous silicon material, fabricated by the process of a glow discharge in silane, is utilized as the body of semiconductor devices.

11 Claims, 7 Drawing Figures

SEMICONDUCTOR DEVICE HAVING A BODY OF AMORPHOUS SILICON AND METHOD OF MAKING THE SAME

BACKGROUND OF THE INVENTION

This is a continuation of application Ser. No. 840,038 abandoned, filed Oct. 6, 1977, which is a division of application Ser. No. 710,183, filed July 30, 1976, now U.S. Pat. No. 4,064,521, which is a continuation-in-part of application Ser. No. 659,268, filed Feb. 19, 1976, now abandoned, which is itself a continuation-in-part of application Ser. No. 599,588, filed July 28, 1975, now abandoned.

The present invention relates to semiconductor devices and more particularly to photovoltaic devices and current rectifying devices whose body is of an amorphous silicon fabricated by a glow dicharge in silane.

Photovoltaic devices such as solar cells and photodetectors are capable of converting solar radiation into usable electrical energy. A problem encountered in the field of solar cells is that the cost of producing electrical energy from solar cells is often not competitive with other means of electrical energy generation. One of the largest expenses involved in solar cell manufacture is the cost of the semiconductor material of the solar cell's body. Often a solar cell will require a thick, single crystal body, i.e. about 20 microns or more, to ensure sufficient absorption of solar radiation. Naturally, the more semiconductor material needed the higher the cost of a solar cell. The lowering of the amount of semiconductor material needed for photodetector devices would also lower their cost. If this same semiconductor material demonstrates current rectification properties in the dark, it could also be utilized as the body of semiconductor devices such as diodes. Thus, it would be most desirable in the semiconductor field to have the body of semiconductor devices of a material which demonstrates either photovoltaic or current rectification properties, and reduces the cost of solar cells, photodetector and current rectification devices.

SUMMARY OF THE INVENTION

A semiconductor device having a semiconductor junction and a body of amorphous silicon fabricated by glow discharge in silane. The body is at or has therein a semiconductor junction.

DETAILED DESCRIPTION OF THE INVENTION

Figure 1:
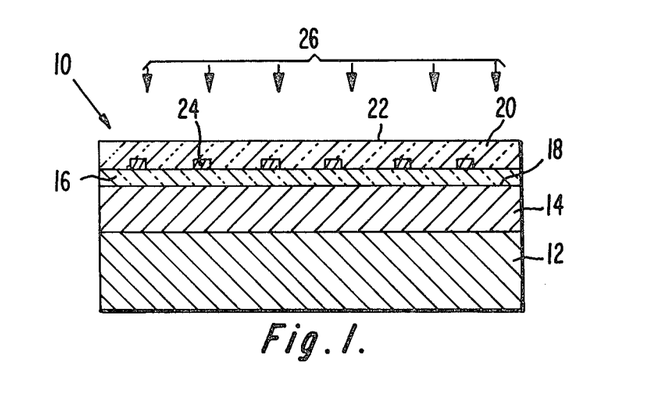
FIG. 1 is a cross-sectional view of a first embodiment of the semiconductor device of the present invention.

Referring to FIG. 1, a first embodiment of a semiconductor device of the present invention is designated as 10. For the purpose of describing the present invention the first embodiment of the semiconductor device 10 is a photovoltaic device, specifically a Schottky barrier solar cell. The photovoltaic device 10 includes a substrate 12 of a material having both good electrical conductivity properties and the ability of making an ohmic contact with amorphous silicon deposited from a glow discharge. Generally, a low work function metal will provide ohmic contacts. Typically, the substrate 12 will be of a metal such as aluminum, niobium, tantalum, chromium, iron, bismuth, antimony, stainless steel or highly doped N type single crystal or polycrystalline silicon. On a surface of the substrate 12 is a body 14 of amorphous silicon fabricated by a glow discharge in silane. The method of deposition well known to those in the art as glow discharge involves the discharge of electricity through gas at relatively low pressure, i.e. about 5 torr or less, in a partially evacuated chamber. A dc glow discharge is characterized by several regions of diffuse, luminous glow, i.e. the positive column which is near the anode and the negative glow which is between the anode and cathode, and by a voltage drop in the vicinity of the cathode, i.e. the Crookes dark space region, that is much higher in voltage than the ionization voltage of the gas.

With respect to the semiconductor devices of the present invention, the depletion region or space charge region of the device will extend across part or all of the semiconductor body. Specifically, for photovoltaic devices the semiconductor body is also that portion of the device in which carriers can be generated for collection as current from the device.

An amorphous material is one which has no long range order in the periodicity of the matrix. Amorphous silicon fabricated by a glow discharge in silane, $SiH_4$, possesses a short range order of no more than 20 Å. The lack of long range order of an amorphous silicon material fabricated by a glow discharge in silane can be detected by X-ray or electron diffraction. The amorphous silicon of the body 14 is formed by a glow discharge in silane, $SiH_4$, and can be distinguished from other amorphous silicon in that it has the kinetic characteristic of an average density of localized states in the energy gap on the order of $10^{17}/cm^3$ or less. The average density of localized states, assuming a uniform spacial distribution, is determined by plotting the ratio of one over the capacitance squared ($1/C^2$) as a function of voltage for the amorphous silicon semiconductor device. From the slope of this plot the average density of the localized states can be determined. Amorphous silicon fabricated by a glow discharge in silane has a drift mobility for electrons of $10^{-3} cm^2/V-sec.$ or greater. The drift mobility for electrons is measured by the well known techniques of impinging light pulses or electron beam pulses on the biased semiconductor device and the subsequent flow of electrons is followed by a sampling system. Furthermore, it has been estimated from photoconductivity measurements that the electron carrier lifetime of amorphous silicon fabricated by a glow discharge in silane is on the order of $10^{-5}$ seconds.

However, it is anticipated that devices with lower electron lifetimes on the order of $10^{-7}$ seconds still have good electrical characteristics.

On a surface of the body 14 opposite the substrate 12 is a metallic region 16, with an interface 18 therebetween. The metallic region 16 is at least semitransparent to solar radiation and is of a metallic material with good electrical conductivity, and is of a high work function, i.e. 4.5 eV or greater such as gold, platinum, palladium, iridium or rhodium. The metallic region 16 may be a single layer of a metal or it may be multi-layered. If the metallic layer 16 is multi-layered a first layer could be of platinum on the body 14 to assure a large Schottky barrier height and a second layer on the first platinum layer could be gold or silver, for good electrical conductivity. Since the metallic region 16 is a metal or metals such as gold, platinum, palladium, chromium, iridium or rhodium, it should only be about 100 Å in thickness in order to be semitransparent to solar radiation.

On a surface of the metallic layer 16 opposite the interface 18 is an electrode 24. Typically, the electrode 24 is in the form of a grid and is of a metal having good electrical conductivity. The grid electrode for purposes of disclosing the present invention has two sets of grid lines, with the grid lines of each set substantially parallel to each other and the grid lines of each set are intersecting those of the other set. For purposes of discussion, the grid lines are intersecting perpendicularly. The grid electrode 24 occupies only a small area on the surface of the metallic layer 16, i.e. about 5 to 10%, since solar radiation impinging the grid electrode 24 may be reflected away from the body 14. The function of the grid electrode 24 is for the uniform collection of current from the metallic layer 16. The grid electrode 24 also assures a low series resistance from the device 10 when in operation as part of a circuit. However, it is anticipated that only a single set of grid lines may be necessary for uniform current collection, for small surface area devices.

An antireflection layer 20 is on the grid electrode 24 and on the surface of the metallic layer 16 opposite the interface 18 not occupied by the grid electrode 24. The antireflection layer 20 has an incident surface 22 on which impinges solar radiation 26. As is well known in the art, there is an increase in the solar radiation 26 traversing the metallic layer 16 and entering the body 14, by having the antireflection layer 20 of a thickness on the order of $\lambda/4n$, where $\lambda$ is the wavelength of the radiation impinging the incident surface 22, and n is the index of refraction of the antireflection layer 20. The index of refraction, n, of the antireflection layer 20 should be of an appropriate value to increase the amount of solar radiation 26 impinging the metallic layer 16. For example, if the metallic layer 16 is platinum, 100 Å in thickness, a suitable antireflection layer 20 would be of zirconium oxide, $ZrO_2$, about 500 Å in thickness with n=2.1. In essence, the antireflection layer 20 reduces the amount of light that would be reflected from the device 10. Usually, the antireflection layer 20 will be of a dielectric material such as zinc sulfide, zirconium oxide or silicon nitride, but it can be a transparent semiconductor material such as tin oxide doped with antimony, or indium oxide doped with tin.

In the field of semiconductor devices it is well known that a surface barrier junction, generally known as a Schottky barrier, is formed as a result of contacting certain metals to certain semiconductor materials, i.e. high work function metals to N type semiconductor materials or low work function metals to P type semiconductor materials. In the present invention a Schottky barrier is formed at the interface 18 by contacting the metallic region 16 to the body 14. A Schottky barrier generates a space charge region in the semiconductor material which penetrates into the body 14 from the interface 18. The space charge region is also referred to as the depletion region. It is preferable in the photovoltaic device 10 of the present invention that the depletion region extend the entire width of body 14 between the interface 18 and the substrate 12. With the depletion region extending the entire width of the body 14, carriers created anywhere in the body 14, as a result of the absorption of solar radiation 26, are swept by the electric field in the depletion region to either the substrate 12 or the metallic region 16. The substrate 12 functions as one of the electrodes to the body 14. If the depletion region did not extend into a portion of the body 14, any carriers generated in this non-depleted portion of the body 14 would not be swept to an electrode by means of the electric field. Carriers generated in a non-depleted portion of the body 14 must rely on diffusion to the depleted region in order to be collected. Also, a non-depleted region may contribute to the series resistance when drawing current from the device, and this series resistance may lower device efficiency.

The amorphous silicon of the body 14, fabricated by a glow discharge in silane, possesses characteristics ideally suited for a photovoltaic device. Electron lifetime in amorphous silicon fabricated by a glow discharge in silane can be on the order of $10^{-7}$ seconds or greater, while electron lifetime in amorphous silicon formed by sputtering or evaporation is in the order of $10^{-11}$ seconds.

Figure 2:
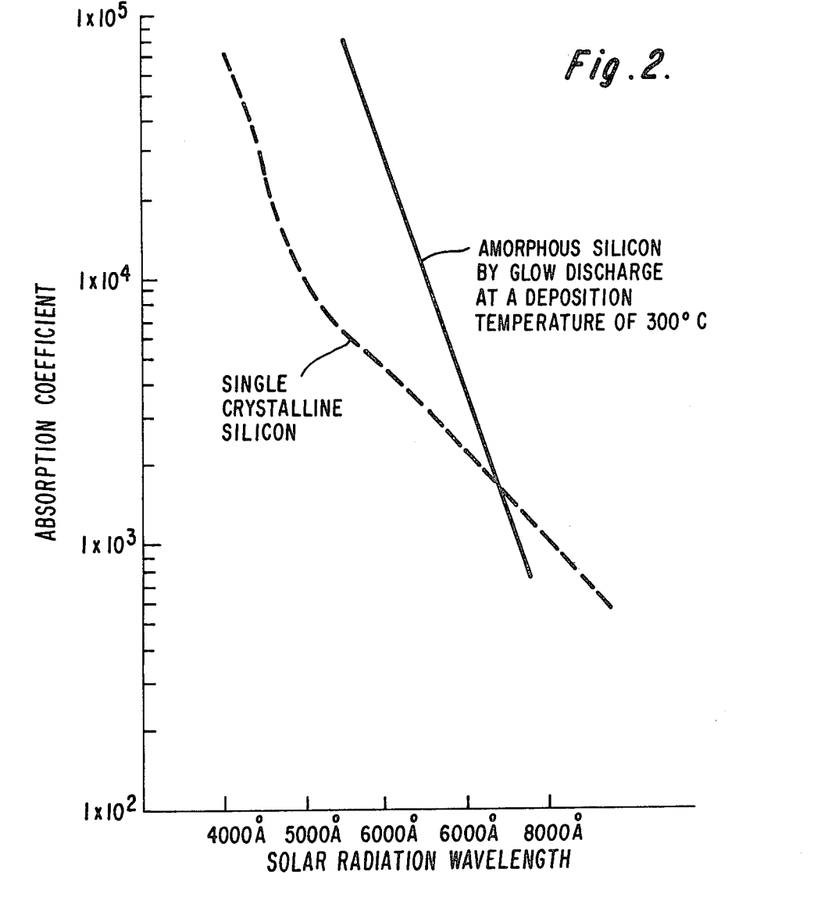
FIG. 2 is a graph comparing the absorption coefficient of single crystal silicon to glow discharge amorphous silicon in the visible light range.

Also, measurements of the spectral response of the device of the present invention indicate a high collection efficiency through the visible portion of the spectrum, e.g. the average collection efficiency in the spectral range of 4,000 Å to 7,000 Å is on the order of 50%. The optical absorption of glow discharge amorphous silicon is superior to that of single crystalline silicon over the visible light range, i.e., 4,000 Å to 7,000 Å. Referring to FIG. 2, it is shown that the amorphous silicon has a larger absorption coefficient over the visible range than single crystalline silicon. This means that a body 14 of glow discharge amorphous silicon can be a factor of 10 thinner than single crystal silicon and provide comparable light absorption in the visible range. This is the reason for the body 14 being as thin or thinner than one micron, and providing good device efficiency.

Furthermore, the average density of localized states in the energy gap of glow discharge amorphous silicon is on the order of $10^{17}/cm^3$ or less. The average density of localized states of glow discharge amorphous silicon decreases with increasing deposition temperatures and increasing purity of the silane in the fabrication of the amorphous silicon. This average density of localized states of the glow discharge amorphous silicon is much lower than that of amorphous silicon fabricated by other means, i.e., for sputtered or evaporated amorphous silicon the average density of localized states is $10^{19}/cm^3$ or greater. Significant about the average density of localized states in the energy gap is that it is inversely proportional to the square of the width of the depletion region. Since glow discharge amorphous silicon's density of states is relatively low a depletion width on the order of one micron can be obtained. Also, significant about the average density of localized states is the fact that carrier lifetime is inversely proportional to the average density of states near mid-gap. This reaffirms the fact that the electron lifetime of glow discharge amorphous silicon is larger than that of amorphous silicon fabricated by the other processes mentioned.

Figure 3:
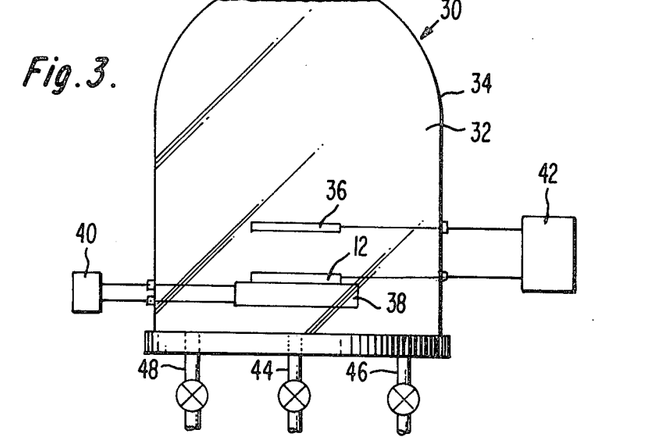
FIG. 3 is a schematic view of a first apparatus for carrying out the fabrication of amorphous silicon by a glow discharge in silane.

Referring to FIG. 3, a first glow discharge apparatus suitable for carrying out the fabrication of the photovoltaic device 10 of the present invention is generally designated as 30. The glow discharge apparatus 30 includes a vacuum chamber 32 defined by a vacuum bell 34, typically of a glass material. In the vacuum chamber 32 is an electrode 36, and a heating plate 38 spaced from and opposite the electrode 36. The electrode 36 is of a metallic material having good electrical conductivity such as platinum and is in the form of a screen or coil. The heating plate 38 is a ceramic frame which encloses heating coils which are energized from a current source 40, external to the vacuum chamber 32.

A first outlet 44 into the vacuum chamber 32 is connected to a diffusion pump, a second outlet 46 is connected to a mechanical pump, and a third outlet 48 is connected to a gas bleed in system which is the source of the various gases utilized in the glow discharge process. While the first outlet 44 is described as being connected to a diffusion pump, it is anticipated that a diffusion pump may not be necessary since the mechanical pump connected to the second outlet 46 may evacuate the system to a sufficient pressure.

In the fabrication of the photovoltaic device 10, the substrate 12, e.g. antimony, is placed on the heating plate 38, and the substrate 12 is connected to one terminal of a power source 42 and the electrode 36 is connected to an opposite terminal of power source 42. A voltage potential therefore exists between the electrode 36 and substrate 12. The power source 42 can be either D.C. or it can be A.C., i.e. in the low frequency range for example 60 Hertz, or it can be R.F., i.e. in the high frequency range, for example on the order of megahertz. Typically, when the power source 42 is D.C., the electrode 36 is connected to the positive terminal of the power source 42, and the substrate 12 is connected to the negative terminal of the power source 42. Thus, the electrode 36 function as an anode and the substrate 12 functions as a cathode when the power source 42 is energized. This is referred to as a cathodic D.C. operation. However, in a D.C. operation the substrate 12 and electrode 36 can be of the opposite polarities described, i.e. the substrate 12 is the anode and the electrode 36 is the cathode, which is referred to as anodic D.C. operation. It has been discovered that the deposition rates are somewhat higher in the cathodic mode than in the anodic mode. Furthermore, R.F. glow discharge operation can be accomplished in electrodeless glow discharge apparatus of a type well known to those in the art, e.g. a capacitive R.F. glow discharge system and an inductive R.F. glow discharge system. However, more uniform deposition over a large area, i.e. greater than 10 cm$^2$, is attained in D.C. or A.C. glow discharge than in electrodeless R.F. glow discharge.

After the substrate 12 and electrode 36 are connected to power source 42 the vacuum chamber 32 is evacuated to a pressure of about $10^{-3}$ to $10^{-6}$ torr, and the substrate 12 is heated to a temperature in the range of 150° to 450° C. by energizing the heating coil to the heating plate 38.

Next, silane, SiH$_4$, is bled into the vacuum chamber 32 to a pressure of 0.1 to 5.0 torr and as a result, the substrate temperature is raised to a value in the range of 200° C. to 500° C.

To initiate the glow discharge between the electrode 36 and the substrate 12, resulting in the deposition of the amorphous silicon of body 14 onto a surface of the substrate 12, the power source 42 is energized. For deposition of the body 14 the current density between the electrode 36 and substrate 12 should be in the range of 0.3 to 3.0 ma/cm$^2$ at the surface of the substrate 12. The deposition rate of the amorphous silicon increases with the vapor pressure of the silane and the current density. For a silane pressure of 1.5 torr, a current density of 1 ma/cm$^2$ at a cathodic substrate 12 and the substrate 12 at 350° C., the deposition of one micron of amorphous silicon occurs in less than one minute.

Once the glow discharge is initiated for the D.C. cathodic mode, electrons are emitted from the substrate 12 and strike silane molecules, SiH$_4$, both ionizing and disassociating the molecules. The positive silicon ions and the positive silicon hydride ions, such as SiH$^+$, are thus attracted to the substrate 12, which is the cathode and silicon containing some hydrogen is thereby deposited on the substrate 12. It is believed that the presence of hydrogen in the body of amorphous silicon is beneficial to good electronic properties. It has been found that a body 14 of amorphous silicon fabricated by a glow discharge in pure silane is of a slightly N type conductivity, when deposited on a substrate 12 which is at a temperature above 100° C.

The temperature of the substrate 12 in the glow discharge process may influence the composition and structure of the material deposited thereon due to the effects of auto doping, eutectic formation and induced crystallization, e.g. deposition on a single crystalline silicon substrate at temperatures above about 500° C. results in the deposition of a polycrystalline silicon, and deposition on a gold substrate at a temperature above 186° C. results in induced crystallization of the deposited silicon.

After deposition of the amorphous silicon, the wafer of substrate 12 and body 14 is placed in a state of the art evaporation system and the metallic region 16 is evaporated onto the body 14. Likewise, the grid electrode 24 and antireflection layer 20 are deposited on the metallic region 16 by state of the art evaporation and masking techniques. The entire processing may be accomplished in a single system accommodating both glow discharge and evaporation.

Fabrication of the photovoltaic device 10 is completed by the connecting of wire electrodes (not shown) to the substrate 12 and grid electrode 24 for connection to external circuitry.

Figure 4:
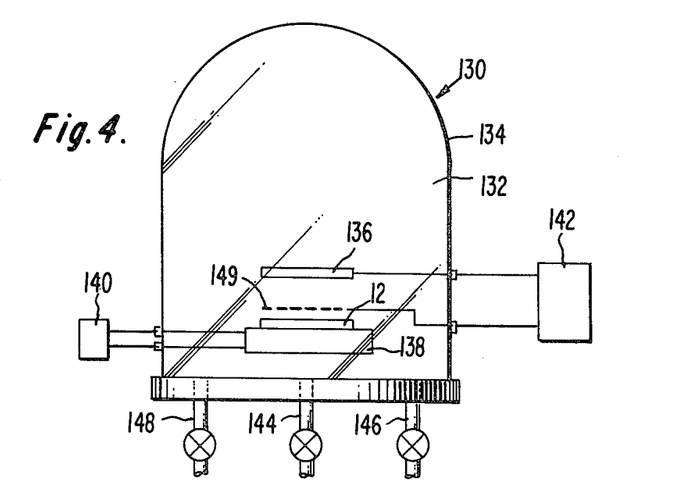
FIG. 4 is a schematic view of a second apparatus for carrying out the fabrication of the amorphous silicon by a glow discharge in silane.

Referring to FIG. 4, a second glow discharge apparatus for the fabrication of the photovoltaic device 10 is designated as 130. The apparatus 130 is similar to the apparatus 30. Specifically, vacuum chamber 132, vacuum bell 134, electrode 136, heating plate 138, current source 140, power source 142, first outlet 144, second outlet 146 and third outlet 148 of apparatus 130 are the same as vacuum chamber 32, vacuum bell 34, electrode 36, heating plate 38, current source 40, power source 42, first outlet 44, second outlet 46 and third outlet 48 of apparatus 30 respectively. Apparatus 130 unlike apparatus 30 has an electrode 149, which is in the form of a screen. The screen electrode 149 is of an electrically conductive material such as a metal like stainless steel, and has openings therein which are smaller in size than the width of the cathode dark space region of the glow discharge which is normal to the substrate. The screen electrode 149 is between the electrode 136 and heating plate 138 and is spaced over the substrate 12 a distance which is on the order of the cathode dark space region of the glow discharge.

The operation of apparatus 130 differs from that of apparatus 30 in that the substrate 12 is not electrically connected to the power source 142, instead the screen electrode 149 is electrically connected to the power source 149. Thus, the screen electrode 149 is connected to one terminal of power source 142 and the electrode 136 is connected to the opposite terminal. If a D.C. cathodic mode of operation is assumed, when the power source 142 is energized and a glow discharge initiated, the positive ions in the glow discharge are drawn to the screen electrode 149. However, most of the positive ions will pass through the openings in the screen electrode 149, so that amorphous silicon is deposited on the substrate 12.

The apparatus 130 having the screen electrode 149 can be used when the substrate 12 is an insulator to which no electrical contact can be made. However, the apparatus 130 can also be utilized in the fabrication of amorphous silicon devices in which the substrate 12 is not an insulator.

The apparatus 130, like the apparatus 30, can be operated in the D.C. cathodic or anodic modes.

Figure 5:
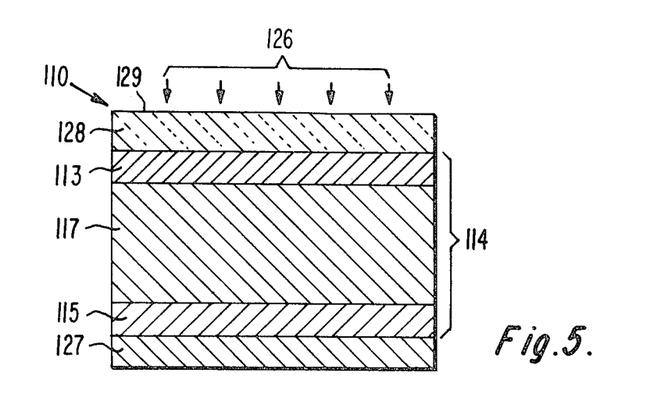
FIG. 5 is a cross-sectional view of a second embodiment of the semiconductor device of the present invention.

Referring to FIG. 5, a second embodiment of the semiconductor device of the present invention is designated as 110. For the purpose of describing the present invention, the semiconductor device 110 is a photovoltaic device and more particularly a PIN solar cell. The photovoltaic device 110 includes a body 114 of amorphous silicon fabricated by a glow discharge in silane, SiH4. Body 114 includes a first doped layer 113, a second doped layer 115 spaced from and opposite the first doped layer 113, and an "intrinsic" layer 117 in contact with and between the first and second doped layers 113 and 115. The "intrinsic" layer 117 is undoped, but is usually slightly N type. The first and second doped layers 113 and 115 are of opposite conductivity type. For purposes of discussion the second doped layer 115 is of N type conductivity while the first doped layer 113 is of P type conductivity. Both the first and second layers 113 and 115 are of a high doping concentration, i.e., greater than $10^{18}/cm^3$ of electrically active dopants. Typically the N type second doped layer 115 is doped with phosphorous and the P type first layer 113 is doped with boron.

A solar radiation transmissive electrode 128 is on a surface of the first doped layer 113 opposite the second doped layer 115. The transmissive electrode 128 has an incident surface 129 opposite the first doped layer 113. The function of transmissive electrode 128 is to be either transparent or semitransparent to solar radiation and be able to collect current generated in the body 114. Solar radiation 126 enters the device 110 at the incident surface 129. The solar radiation transmissive electrode 128 may be a single layer of a material such as indium tin oxide or tin oxide which are both transparent to solar radiation and have good electrical conductivity. Also, the transmissive electrode 128 can be a thin film metal, i.e. about 100 Å in thickness, such as chromium, antimony, palladium, or platinum, which will be semitransparent to solar radiation. If the transmissive electrode 128 is of a thin film metal it is preferable that an antireflection layer as described in the first embodiment be on the incident surface 129 of the electrode 128 to decrease reflection of the solar radiation 126. Furthermore, the electrode 128 may be multi-layered such as a layer of indium tin oxide on a layer of a glass material. In such an instance the indium tin oxide is in intimate contact with the first doped layer 113.

If the surface resistivity of the electrode 128 at the first doped layer 113 is on the order of about 10 Ω/□ or more it is preferable to also have a grid contact like that of the first embodiment of the present invention on the first doped layer 113 for collection of the current generated in the body 114.

An electrical contact 127 is on a surface of the second doped layer 115 opposite the transmissive electrode 128. The electrical contact 127 is of a material having reasonable electrical conductivity, such as aluminum, chromium, tantalum, antimony, or niobium.

As previously recited in the discussion of the first embodiment of the present invention, the absorption coefficient of glow discharge amorphous silicon is better than that of single crystal silicon in the visible range. For this reason only a thin layer of amorphous silicon is needed for sufficient solar radiation absorption. Typically, the "intrinsic" region of amorphous silicon is about one micron or less in thickness, while the first and second doped layers 113 and 115 are each a few hundred angstroms in thickness.

Well known to those in the PIN solar cell art is that as a result of the equalization in Fermi levels between layers 113, 115 and 117 there is a negative space charge in the first doped layer 113 and a positive space charge in the second doped layer 115, and the formation of built-in potential between the layers 113 and 117, and 115 and 117, and also the formation of a depletion region in the "intrinsic" layer 117. How far the electric field of the depletion region extends into the "intrinsic" layer 117 is a function of the average density of localized states in the energy gap, as explained in the discussion of the first embodiment of the present invention and the magnitude of the built-in potential. Also, from the earlier discussion of semiconductor device 10, it is foreseen that the depletion region can extend across the entire thickness of the "intrinsic" layer 117, i.e. about one micron or less in thickness, as long as the built-in potential is sufficiently high. Therefore, any carriers generated in the "intrinsic" layer 117 by the absorption of solar radiation, will be swept up in the electric field of the depletion region and be collected as an electrical current.

In the fabrication of the photovoltaic device 110 the transmissive electrode 128 is assumed to be a layer of indium tin oxide on a layer of glass material. The electrode 128 is placed on the heating plate 38 of the apparatus 30 shown in FIG. 3. The glass layer of electrode 128 is in intimate contact with the heating plate 38.

The apparatus 30 is then prepared for deposition of the first doped layer 113, of P type conductivity onto the indium tin oxide layer of electrode 128. The vacuum chamber 32 is evacuated to a pressure of about $10^{-6}$ torrs and then silane with about one-half to five percent diborane, i.e. the diborane constitutes one-half to five percent of the silane-diborane atmosphere, at a pressure of 0.1 to 1.0 torr is bled into the vacuum chamber 32, while the electrode 128 is brought to a temperature in the range of 200° C. to 500° C.

A glow discharge is initiated in the vacuum chamber 32 for about one to two seconds with a current density of about 0.5 ma/cm² at the electrode 128 for deposition of the first doped layer 113, on the order of a few hundred angstroms in thickness.

The atmosphere in the vacuum chamber 32 is then pumped out by the mechanical pump 46. With the vacuum chamber 32 at a pressure of $10^{-6}$ torr, silane is bled into the vacume chamber 32 at a pressure of 0.1 to 5 torr. Again a glow discharge is initiated for 1 to 5 minutes with a current density of from 0.5 ma/cm² to 3.0 ma/cm² at the surface of the first doped layer 113 for the deposition of the "intrinsic" layer 117 of about one micron in thickness.

Next, about 0.1 to 1.0 percent phosphine, as the doping gas, is bled into the vacuum chamber 32, so that the phosphine constitutes 0.1 to 1.0 percent of the silane-phosphine atmosphere. A glow discharge is initiated with a current density of from 0.3 ma/cm² to 3.0 ma/cm² at the surface 14 of the "intrinsic" layer 117 and the N type second doped layer 115 on the order of a few hundred angstroms in thickness is deposited on the surface of the intrinsic layer 117.

While phosphine and diborane were mentioned as the doping gases for the first and second doped layers 113 and 115, it is anticipated that other appropriate doping gases well known in the art can also be used.

The electrical contact 127 is then deposited on a surface of the second doped layer 115 by state of the art evaporation techniques. Final fabrication of the photovoltaic device 110 includes connecting contacting wires (not shown) to the contact 127 and electrode 128 for electrical connection to external circuitry.

Figure 6:
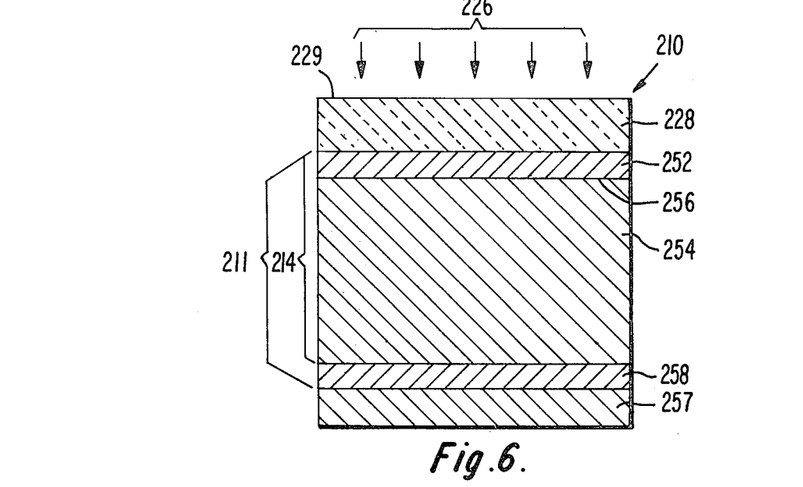
FIG. 6 is a cross-sectional view of a third embodiment of the semiconductor device of the present invention.

Referring to FIG. 6, a third embodiment of the semiconductor device of the present invention is designated as 210. Again the semiconductor device 210 is a photovoltaic device and more particularly a P-N junction solar cell. The photovoltaic device 210 includes a region 211 of amorphous silicon fabricated by a glow discharge in silane, $SiH_4$, with the appropriate doping gases. The region 211 comprises a first doped layer 252 of one conductivity type in contact with a second doped layer 254 of an opposite conductivity type with a P-N junction 256 therebetween. For purposes of discussion it is assumed the first doped layer 252 is of P type conductivity and the second doped layer 254 is of N type conductivity. Both the first and second doped layers 252 and 254 are the body 214 of the photovoltaic device 210. The region 211 includes a third doped layer 258 on a surface of the second doped layer 254 opposite the P-N junction 256. The third doped layer 258 is of the same conductivity type as the second doped layer 254 but has a higher doping concentration than the second doped layer 254. Thus, the third doped layer 258 is of N+type conductivity. The third doped layer 258 assists in making ohmic contact to the body 214.

On a surface of the third doped layer 258 opposite the P-N junction 256 there is an electrical contact 257 the same as the electrical contact 127 of the second embodiment of the present invention. A solar radiation transmissive electrode 228 having a solar radiation incident surface 229 is on a surface of the first doped layer 252 opposite the P-N junction 256. Solar radiation 226 enters the device 210 at the incident surface 229. The solar radiation transmissive electrode 228 is the same as the solar radiation transmissive electrode 128 of the second embodiment of the present invention.

In the operation of the photovoltaic device 210 solar radiation 226 enters the device 210 at the incident surface 229 and some of the solar radiation 226 is absorbed in the body 214 forming electron-hole pairs. These carriers then diffuse to the P-N junction 256 and if they arrive at the space charge region of the P-N junction 256 before recombining they are collected and contribute to the current of the device 210.

In the fabrication of the device 210, as in device 110, the transmissive electrode 228 is assumed as being a layer of indium tin oxide on a layer of glass material. The electrode 228 is placed on the heating plate 38 of apparatus 30 so that the glass layer is in intimate contact with the heating plate 38.

Next, the apparatus is prepared for the deposition of the first doped layer 252 onto the indium tin oxide layer of the transmissive electrode 228. The vacuum chamber is evacuated to a pressure of about $10^{-6}$ torrs and then silane with about 0.5 to 5 percent diborane at a pressure of 0.1 to 1.0 torr is bled into chamber 32, while the electrode 228 is brought to a temperature in the range of 200° C. to 500° C.

A glow discharge is initiated in the vacuum chamber 32 for about one to two seconds with a current density of about 0.5 ma/cm² at the surface of electrode 228 for deposition of the first doped layer 252 on the order of a few hundred angstroms in thickness.

The atmosphere in the vacuum chamber 32 is then pumped out by the mechanical pump 46. The chamber 32 is brought to a pressure of about $10^{-6}$ torr and silane with about 0.01 percent phosphine is then bled into the chamber 32 at a pressure of 0.1 to 5 torr. The glow discharge is initiated for about 1 to 30 minutes with a currrent density of from 0.3 ma/cm² to 3.0 ma/cm² at the surface of the first doped layer 252, thereby the second doped layer 254 is deposited of a thickness of about one micron.

Next, phosphine is bled into the vacuum chamber 32 so that there is a 1.0 percent mixture of phosphine with the silane. Again a glow discharge is initiated with a current density of from 0.3 ma/cm² to 3.0 ma/cm² at the surface of the second doped layer 254 for the deposition of the third doped layer 258 a thickness of a few hundred angstroms.

The electrical contact 257 is deposited on the third doped layer 258 by state of the art evaporation techniques. The fabrication of device 210 is completed by connecting contacting wires (not shown) to contact 227 and electrode 228.

The glow discharge apparatus 130 shown in FIG. 4 can also be utilized in fabricating the second and third embodiments of the present invention.

In the photovoltaic operation of the first, second and third embodiments of the present invention, the substrate 12 and electrical contacts 127 and 257 may reflect unabsorbed solar radiation back into the body 14, 114 and 214 respectively, thereby improving the possibility for solar radiation absorption.

It should be mentioned that in the first embodiment of the present invention, the substrate 12 was described as a support for the device while in the second and third embodiments the light transmissive electrodes 128 and 228 are supports for their respective devices.

Although the three embodiments of the semiconductor device of the present invention have been described as solar cells, it is anticipated by the present invention that these three embodiments can also be utilized as high frequency photodetectors, i.e. devices which respond to radiant energy. It has been discovered that photodetectors having a body of amorphous silicon prepared by a glow discharge in silane have a high frequency response, on the order of 10 megahertz or more. In utilizing the three embodiments of the present invention as a photodetector it is known by those in the semiconductor art that the amount of radiant energy entering the body may not be as critical as if the three embodiments were utilized as solar cells. Therefore, modifications well known to those in the art can be made to the first three embodiments of the present invention if they are used as photodetectors, e.g. removal of antireflection layers and replacement of the grid electrode 24 with a contact pad. The second embodiment of the present invention, semiconductor device 110, is a PIN structure, and if utilized as a photodetector its spectral response can be tailored to the relative sensitivity of the human eye. Tailoring the spectral response of semiconductor device 110 is accomplished through the thickness and dopant concentration of the layer which is of P type conductivity, i.e. either first doped layer 113 or second doped layer 115, and by the thickness of the "intrinsic" layer 117. As an example, the spectral response of device 110 approximates that of the human eye if the P type layer has an acceptor dopant concentration on the order of 5 atomic percent boron and is of a thickness of about 500 Å, while the "intrinsic" region is approximately 0.3 micrometers in thickness.

The utilization of glow discharge amorphous silicon in the body of photovoltaic and photodetector devices provides a device with a thinner body than devices of the same basic structure but of single crystalline silicon. Also devices utilizing glow discharge amorphous silicon are capable of solar radiation absorption comparable to that of single crystal silicon photovoltaic and photodetector devices having bodies of a factor of 10 times thicker. Thus, the specific advantage of the present invention as a photovoltaic or photodetector device is the cost reduction realized by the utilization of a thinner body. Moreover, the present invention as a photovoltaic device also provides a cost reduction in generation of electrical power from solar radiation because there is less energy expended in making devices of the present invention since fabrication is at temperatures lower than single crystal device fabrication; and larger area solar cells can be fabricated as compared to single crystalline solar cell fabrication.

It has also been discovered that the semiconductor devices of the present invention having a body of amorphous silicon fabricated by a glow discharge in silane, is capable of current rectification in the dark. As an example the Schottky barrier semiconductor device 10 of FIG. 1, with a substrate 12 of N type single crystalline silicon, a metallic region 16 of gold, 1000 to 2000 Å in thickness so as to function as an electrical contact, and without the grid electrode 24 and antireflection layer 20, demonstrates current rectification at +0.4 volts, i.e. forward biased, on the order of $10^4$ times greater than the current at −0.4 volts, i.e. reverse biased. While the three embodiments of the present invention are described as solar cells they can function as described as current rectifiers but it would be obvious to those skilled in the semiconductor art that their utility as rectifiers would be more desirable with some minor modification, such as the removal of antireflection layers.

Figure 7:
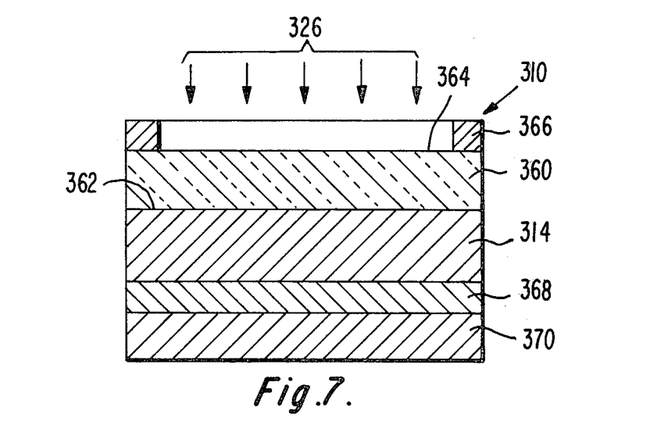
FIG. 7 is a cross-sectional view of a fourth embodiment of the semiconductor device of the present invention.

Referring to FIG. 7, a fourth embodiment of the semiconductor device of the present invention is designated as 310. The semiconductor device 310 is described as a heterojunction photovoltaic device for the purpose of explaining the fourth embodiment of the present invention. The photovoltaic device 310 includes a body 314 of amorphous silicon fabricated by a glow discharge in silane. The body 314 of amorphous silicon has the same characteristics as the body 14 of amorphous silicon described in the first embodiment of the present invention.

On a surface of the body 314 is a semiconductor region 360. The semiconductor region 360 is of a different semiconductor material than that of body 314 so as to form a heterojunction 362 between. Both the body 314 and semiconductor region 360 may be of the same conductivity type or of opposite conductivity type. The semiconductor region 360 has an incident surface 364 opposite the body 314. Solar radiation 326 is capable of impinging the device 310 at the incident surface 364. The body 360 is of a high bandgap semiconductor material, i.e. about 2.0 eV or greater, so as to be transparent or semitransparent to solar radiation 326 impinging the incident surface 364. As is well known in the art, the higher the bandgap of the semicoductor region 360 the less solar radiation 326 will be absorbed in the region 360. Also obvious to those skilled in the photovoltaic art is that it is desirable to have a large potential barrier in the vicinity of the heterojunction 362 for the generation of a large open circuit voltage. A potential barrier at the heterojunction 362 is the result of properly matching the band structures of the semiconductor material of region 360 to the band structure of the amorphous silicon of body 314 as to produce band bending at the heterojunction 362. Furthermore, the band structure of the semiconductor material of the region 360 should be chosen so that there is not a discontinuity, e.g. a spike, in the band structure at the heterojunction 362 that will trap photogenerated carriers. Typically, semiconductor materials which can be utilized for the semiconductor region 360 are materials such as tin oxide, indium tin oxide, gallium arsenide, or single crystalline silicon.

On a portion of the incident surface 364 is a first electrode 366. The first electrode 366 is of a material such as a metal which will form a good electrical contact with the semiconductor region 360. As previously stated for the first embodiments of the present invention, it is desirable that the electrode 366 occupy a small amount of surface area on the incident surface 364. The first electrode 366 need only be on the periphery of the incident surface 364 as shown, if the semiconductor material of the semiconductor region 360 is highly doped so as to have a low sheet resistance, i.e. less than 10 ohms/□. If the sheet resistance of the semiconductor region 360 is greater than 10 ohms/□ then it may be necessary that the first electrode 366 be in the form of a grid or fingered structure. There is a second reason why it is desirable to have the semiconductor region 360 highly doped. As is well known to those in the semiconductor art, the more highly doped is the semiconductor region 360 the less the electrical field generated by the potential barrier at the heterojunction 362 will penetrate into the semiconductor region 360, and the farther it will penetrate into the body 314. Since it is desirable that region 360 be low in solar radiation absorption, an electric field within region 360 will do little to increase the amount of current generated from the device 310.

On a surface of the body 314 opposite semiconductor region 316 is an intermediate layer 368. The intermediate layer 368 is of the same conductivity type as the body 314 but of higher conductivity concentration. On the intermediate layer 368 opposite the body 314 is a second electrode 370. The second electrode 370 is typically of a metal having good electrical properties.

The intermediate layer 368 is of a material which will make ohmic contact to the second electrode 370. Typically, the intermediate layer 368 will be of doped amorphous germanium, doped amorphous germanium-silicon alloy, or a doped amorphous silicon. These materials are fabricated by a glow discharge process. The intermediate layer 368 is of N type conductivity if the body 314 is slightly N type. It is desirable that the intermediate layer 368 be doped, i.e. to about 5 atomic percent, so as to provide an ohmic contact with second electrode 370. The intermediate layer 368 can be uniformly doped or the doping can be graded. With graded doping the dopant concentration is highest at the interface of the intermediate layer 368 and second electrode 370 and is of an insignificant doping concentration at the interface of body 314 and intermediate layer 368.

As previously stated, if the semiconductor region 360 is highly doped most of the space charge region, i.e. the depletion region, will be generated within the body 314 of amorphous silicon. Therefore, the solar radiation 326 which is absorbed within the depletion region in the body 314 and the small amount that is absorbed within region 360 will generate electron-hole carriers which will be swept by the electrical field to either the first electrode 366 or the second electrode 370, thereby generating the electric current of the device 310. Outside the depletion region the photogenerated carriers must rely on diffusion to reach the junction. Furthermore, a graded doping concentration in the intermediate layer will generate an electric field within the intermediate layer which will assist in collection of photogenerated carriers.

The fabrication of the photovoltaic device 310 is similar to that of the embodiments previously described. The semiconductor region 360 may function as the support in a glow discharge apparatus 30 or 130 for the deposition of the body 314 of amorphous silicon. As an alternative method of fabrication, the body 314 can be formed by a glow discharge in silane and the semiconductor region 360 can then be sputtered onto the body 314. Next, the first electrode 366, the intermediate layer 368 and the second electrode 370 are formed by masking and evaporation techniques well known to those in the art.

While the fourth embodiment of the present invention has been described as a photovoltaic device, it is obvious to those skilled in the semiconductor art that such a device can also function as a rectifier. If the semiconductor device 130 were operated as a rectifier, there would be no need for the semiconductor region 360 being of a material which is semitransparent or transparent to solar radiation. In addition there would also be no need for an incident surface 364 which is capable of solar radiation impinging thereon.

The semiconductor device of the present invention possesses a semiconductor junction, i.e. either a P-N junction, a PIN junction, a heterojunction or a Schottky barrier junction. From the description of the semiconductor devices of the present invention, it is evident that the body of amorphous silicon fabricated by a glow discharge in silane is either at or has therein a semiconductor junction.

In the semiconductor device of the present invention, the body is of amorphous silicon fabricated by a glow discharge in silane and these devices function either as solar cells, photodetectors or current rectifiers.

We claim:

1. A method of fabricating an amorphous silicon semiconductor device incorporating a rectifying junction, said method comprising:
placing an electrically conductive substrate in a glow discharge apparatus;
reducing the pressure in said apparatus to a pressure of from about $10^{-3}$ to about $10^{-6}$ Torr;
heating said substrate to a temperature of from about 150° to about 450° C.;
initiating a glow discharge in an atmosphere including silane at a pressure of about 0.1 to about 0.5 Torr so as to form a body of amorphous silicon on said electrically conductive substrate;
continuing said glow discharge while altering the relative proportion of silane and conductivity modifiers such that said body has layers of differing conductivity, said layers forming rectifying junction; and
fabricating an electrical contact to said body of amorphous silicon opposite to the surface contacting said electrically conductive substrate.

2. The method of fabrication in accordance with claim 1 wherein diborane is included with the silane with the concentration of the diborane being in the range of one-half to five percent of the silane-diborane atmosphere, so that said body is doped with boron.

3. The method of fabrication in accordance with claim 1 wherein phosphine is included with the silane with the concentration of the phosphine being in the range of 0.1 to 1.0% of the silane-phosphine atmosphere, so that said body is doped with phosphorous.

4. The method according to claim 1 wherein a layer of N-type amorphous silicon is fabricated on said electrically conductive substrate, a layer of intrinsic amorphous silicon is fabricated on said N-type layer and a layer of P-type amorphous silicon is fabricated on said intrinsic layer, said layers forming said body of amorphous silicon.

5. The method according to claim 1 wherein a layer of N-type amorphous silicon is fabricated on said electrically conductive substrate and a layer of P-type amorphous silicon is fabricated on said N-type layer, said layers forming said body of amorphous silicon.

6. The method according to claim 1 wherein a layer of P-type amorphous silicon is fabricated on said electrically conductive substrate, a layer of intrinsic amorphous silicon is fabricated on said P-type layer and a layer N-type amorphous silicon is fabricated on said intrinsic layer, said layers forming said body of amorphous silicon.

7. The method according to claim 1 wherein a layer of P-type amorphous silicon is fabricated on said substrate and a layer of N-type amorphous silicon is fabricated on said P-type layer, said layers forming said body of amorphous silicon.

8. A method of fabricating a Schottky barrier amorphous silicon semiconductor device comprising;
placing a electrically conductive substrate in a glow discharge apparatus, said substrate being capable of forming an ohmic contact with a subsequently deposited body of amorphous silicon;
evacuating said glow discharge apparatus to a pressure of from about $10^{-3}$ to $10^{-6}$;
heating said substrate to a temperature of 150° C. to 450° C.;

initiating a glow discharge in an atmosphere including silane at a pressure of from 0.1 to 5.0 Torr so as to form a body of amorphous silicon on said electrically conductive substrate; and fabricating a layer on said body of amorphous silicon which is capable of forming a Schottky barrier with said amorphous silicon.

9. The method according to claim 8 wherein conductivity modifiers are incorporated into a layer in said body of amorphous silicon contiguous to said substrate to enhance the formation of an ohmic contact thereto.

10. A glow discharge apparatus capable of depositing a body of amorphous silicon on the surface of a substrate, wherein said body of amorphous silicon can form a rectifying junction within said body or at the surface of said body, said apparatus comprising;

a vacuum chamber;

an electrode in said vacuum chamber electrically connected to a terminal of a DC power source;

a heating element in said vacuum chamber capable of upholding said substrate;

a screen electrode in said vacuum chamber electrically connected to an opposite terminal of said DC power source and spaced between said electrode and said heating element with the spacing between screen electrode and said substrate at a pressure of from about 0.1 to about 5.0 Torr being on the order of the cathode dark space region of the glow discharge; and a source adapted to incorporate N-type or P-type dopants into said vacuum chamber during the fabrication said body of amorphous silicon.

11. The glow discharge apparatus in accordance with claim 10 wherein said screen electrode has openings therein which are smaller in size than the width of the cathode dark space region of the glow discharge which is normal to the substrate.

* * * * *

UNITED STATES PATENT AND TRADEMARK OFFICE
CERTIFICATE OF CORRECTION

PATENT NO. : 4,317,844

DATED : March 2, 1982

INVENTOR(S) : David Emil Carlson

It is certified that error appears in the above-identified patent and that said Letters Patent is hereby corrected as shown below:

Claim 1, line 11      delete "0.5" and insert --5.0--

*Signed and Sealed this*

*Twenty-second*    Day of *February 1983*

[SEAL]

*Attest:*

GERALD J. MOSSINGHOFF

*Attesting Officer*     *Commissioner of Patents and Trademarks*